United States Patent [19]
Yamamoto et al.

[11] Patent Number: 5,844,452
[45] Date of Patent: Dec. 1, 1998

[54] PIEZOELECTRIC LADDER FILTER UTILIZING RESONATOR WITH ELECTRODES ON OPPOSITE SIDE EDGES

[75] Inventors: Takashi Yamamoto, Ishikawa-ken; Tetsuo Takeshima, Toyama, both of Japan

[73] Assignee: Murata Manufacturing Co., Ltd., Kyoto, Japan

[21] Appl. No.: 763,252

[22] Filed: Dec. 10, 1996

[30] Foreign Application Priority Data

Apr. 1, 1996 [JP] Japan ................................ 8-106230

[51] Int. Cl.⁶ .......................... H03H 9/205; H03H 9/58; H03H 9/10
[52] U.S. Cl. ........................ 333/189; 333/192; 310/348; 310/368
[58] Field of Search ................................ 333/189, 186, 333/192; 310/348, 351, 353, 368

[56] References Cited

U.S. PATENT DOCUMENTS

| 4,323,865 | 4/1982 | Tanaka et al. | 333/189 X |
| 4,454,444 | 6/1984 | Fujiwara et al. | 310/348 X |
| 5,400,001 | 3/1995 | Asakawa et al. | 310/357 |
| 5,596,244 | 1/1997 | Kogou et al. | 310/348 |

FOREIGN PATENT DOCUMENTS 63-253711 A  10/1988  Japan ................................. 333/189

OTHER PUBLICATIONS

Jumonji; "High–Impedence Piezielectric Ceramic Resonators and Their Application to Ladder Filters"; *Electronics and Communications in Japan*, vol. 53–A, No. 8, 1970; pp. 17–23, Jan. 1970.

Primary Examiner—Benny Lee
Assistant Examiner—Barbara Summons
Attorney, Agent, or Firm—Graham & James LLP

[57] ABSTRACT

A piezoelectric resonator having a miniature size and being fabricated at a low cost is used in a ladder-type filter that has a substrate, on the front and back surfaces of which line electrodes are provided. A series resonator includes a substantially rectangular piezoelectric plate vibrating in a length vibration mode and has vibrating electrodes located on a pair of opposite side edge surfaces of the substantially rectangular piezoelectric substrate. A parallel resonator including a substantially rectangular piezoelectric plate vibrating in a length vibration mode has vibrating electrodes located on the front and back major surfaces of the substantially rectangular piezoelectric substrate. The series and parallel resonator are mounted on the substrate in such a manner as to be spaced apart from each other. The vibrating electrodes of the series resonator are connected with the line electrodes, respectively, by using a conductive adhesive agent. One of the vibrating electrodes of the parallel resonator is connected to the vibrating electrode of the series resonator through a conductive adhesive agent. Further, the other of the vibrating electrodes of the parallel resonator is connected to the remaining line electrode through a metallic wire.

20 Claims, 14 Drawing Sheets

PIEZOELECTRIC LADDER FILTER UTILIZING RESONATOR WITH ELECTRODES ON OPPOSITE SIDE EDGES

BACKGROUND OF THE INVENTION

1. Field of the Invention

The present invention generally relates to a piezoelectric resonator and more particularly to a piezoelectric resonator included in a filter, such as a ladder-type filter used in communication equipment and also relates to a piezoelectric resonator included in an oscillator.

2. Description of the Related Art

FIG. 14A is a perspective diagram illustrating a primary part of an example of a conventional ladder-type filter. FIG. 14B is an electrical equivalent circuit of the conventional ladder-type filter shown in FIG. 14A.

The conventional ladder-type filter 1 shown in FIG. 14A has piezoelectric vibrators (or transducers) 2 and 3, which function as series resonators, and piezoelectric vibrators 4 and 5, which function as parallel resonators. These piezoelectric vibrators 2, 3, 4 and 5 vibrate in a length or longitudinal vibration mode. The two piezoelectric vibrators 2 and 3 have rectangular piezoelectric substrates 2a and 3a, respectively. Moreover, full-surface electrode films 2b and 3b are disposed on one of two opposite major surfaces of the corresponding one of the piezoelectric substrates 2a and 3a. Furthermore, full-surface electrode films 2c and 3c are disposed on the other of the two opposite major surfaces of the corresponding one of the piezoelectric substrates 2a and 3a.

Similarly, the piezoelectric vibrators 4 and 5 have rectangular piezoelectric substrates 4a and 5a, respectively. Further, full-surface electrode films 4b and 5b are disposed on one of two opposite major surfaces of the corresponding one of the piezoelectric substrates 4a and 5a. Moreover, full-surface electrode films 4c and 5c are disposed on the other of the two opposite major surfaces of the corresponding one of the piezoelectric substrates 4a and 5a.

The piezoelectric vibrators 2 and 4 are mounted on a strip-like terminal plate 6a such that the vibrators 2 and 4 are parallel to each other. A conductive rubber sheet 7 is bonded onto the terminal plate 6a by using an insulating or conductive adhesive agent (not shown). Further, the full-surface electrode films 2c and 4c of the piezoelectric vibrators 2 and 4 are bonded onto the conductive rubber sheet 7, respectively, by using an insulating or conductive adhesive agent (not shown). In this case, a portion of each of the piezoelectric vibrators 2 and 4, which portion is located in the vicinity of a node (or nodal point) of the longitudinal vibration thereof, namely, in the proximity of a center or midpoint located along the length of the vibrators 2 and 4 thereof, is bonded onto the conductive rubber sheet 7.

On the other hand, the piezoelectric vibrators 3 and 5 are disposed on a strip-like terminal plate 6c such that the vibrators 3 and 5 are parallel to each other. A conductive rubber sheet 7 is bonded onto the output terminal plate 6c by using an insulating or conductive adhesive agent (not shown). Further, the full-surface electrode films 3c and 5c of the piezoelectric vibrators 3 and 5 are bonded onto the conductive rubber sheet 7, respectively, by using an insulating or conductive adhesive agent (not shown). In this case, a portion of each of the piezoelectric vibrators 3 and 5, which portion is located in the vicinity of a node of the longitudinal vibration thereof, namely, in the proximity of the center or midpoint located along a length of the vibrators 3 and 5 thereof, is bonded onto the conductive rubber sheet 7.

Further, the full-surface electrode film 2b of the via wire bonding is necessary. Consequently, the number of components inevitably increases. Moreover, the process of fabricating the filter is difficult and complex. Hence, the manufacturing cost of the filter is high.

Furthermore, in the case of the conventional ladder-type filter 1, in order to secure a sufficient capacitance ratio between the series resonator and the parallel resonator, the piezoelectric vibrators used as the series resonators must be formed so that the thickness thereof is large compared to the thickness of the piezoelectric vibrators used as the parallel resonators. Because of the increased thickness of each of the piezoelectric vibrators used as the series resonators and fixed to the terminal plates, the mounting height of each of the vibrators is relatively high. Consequently, the height of a product containing such a ladder-type filter is high. Thus, the increased thickness and resultant increased mounting height prevents miniaturization of the product containing the ladder-type filter shown in FIG. 14A.

This is especially a problem because, in recent years, there has been a growing requirement for reducing the height of such products with increasing demand for fabricating a ladder-type filter as a chip. Thus, the miniaturization of piezoelectric resonators piezoelectric vibrator 2 and an input terminal plate 6b are interconnected by a bonding wire 9a. The full-surface electrode film 4b of the piezoelectric vibrator 4 and a grounding terminal plate 6d are interconnected by a bonding wire 9b. The full-surface electrode film 3b of the piezoelectric vibrator 3 and the terminal plate 6a are interconnected by the bonding wire 9d. The full-surface electrode film 5b of the piezoelectric vibrator 5 and the grounding terminal plate 6d are interconnected by a bonding wire 9c.

In this case, the piezoelectric vibrators 2 and 3 are connected in series and the piezoelectric vibrators 4 and 5 are connected in parallel between the input terminal plate 6b and the output terminal plate 6c. A ladder structure is formed by alternately combining the piezoelectric vibrators 2 and 3, which function as the series resonators, with the piezoelectric vibrators 4 and 5, which function as the parallel resonators, respectively, arranged in a ladder form.

However, in the conventional ladder-type filter 1, the full-surface electrode films provided on the top surface of each of the piezoelectric vibrators, which are used as piezoelectric resonators, and the corresponding terminal plate must be interconnected by a bonding wire electrically and mechanically. It is thus necessary to connect each resonator with terminal plates at two points thereof, respectively, through wire bonding. To connect the resonators with the terminal plates, a total of eight points of connection for use in ladder-type filters is a serious problem.

SUMMARY OF THE INVENTION

To overcome the problems of the prior art described above, the preferred embodiments of the present invention provide a piezoelectric resonator which has a reduced height and can be manufactured much more easily and at a substantially reduced cost as compared to the prior art piezoelectric resonators. The preferred embodiments of the present invention provide a piezoelectric resonator that comprises: a resonating element including a piezoelectric substrate and electrodes disposed on opposite sides of the piezoelectric substrate, the piezoelectric substrate having a substantially rectangular shape and vibrating in a length or longitudinal vibration mode; and a supporting structure which is arranged such that one of two opposite edge portions extending in the direction of the length of the resonating element and the other of the two opposite edge portions extending in the direction of the length thereof are supported by two separate conductive supporting members.

In accordance with another preferred embodiment of the present invention, there is provided a ladder-type filter (hereinafter referred to as a first ladder-type filter) that comprises: a substrate having first, second and third conductive paths; and a series resonator which is adapted to vibrate in a length vibration mode and is provided with a piezoelectric substrate having a substantially rectangular shape. Electrodes are disposed on one of two opposite side edge surfaces of the piezoelectric substrate of the series resonator and on the other of the two opposite side edge surfaces of the piezoelectric substrate of the series resonator. The first ladder-type filter further comprises: a parallel resonator, which is adapted to vibrate in a length vibration mode and is provided with a piezoelectric substrate having a substantially rectangular shape. Electrodes are disposed on one of two opposite major surfaces of the piezoelectric substrate of the parallel resonator and on the other of the two opposite major surfaces of the piezoelectric substrate of the parallel resonator. The parallel resonator is mounted in such a way as to be spaced apart from the series resonator. Moreover, the first ladder-type filter further comprises: first and second supporting members that are disposed in a central portion along the direction of the length of the series resonator such that each of the first and second supporting members is located at one of two opposite edge portions extending in the direction of the width of a major surface of the series resonator and are arranged to support the series resonator and to electrically connect the electrodes, which are formed on the two opposite side edge surfaces of the series resonator, with the first and second conductive paths, respectively; a third supporting member which is disposed in a central portion located along the direction of the length of a major surface of the parallel resonator and is operative to support the parallel resonator on the substrate thereof and to electrically connect one of the electrodes disposed on the major surface of the parallel resonator with one of the second and third conductive paths; and a connection member for electrically connecting one of the second and third conductive paths, which is not connected to the one of the electrodes of the parallel resonator, with the other of the electrodes of the parallel resonator.

In accordance with still another preferred embodiment of the present invention, there is provided another ladder-type filter (hereinafter referred to as a second ladder-type filter) that comprises: a series resonator adapted to vibrate in a length vibration mode and including a piezoelectric substrate having a substantially rectangular shape, electrodes disposed on one of two opposite side edge surfaces of the piezoelectric substrate, and on the other of the two opposite side surfaces of the piezoelectric substrate,; conductive supporting members that are arranged to support each of two opposite side edge portions and to extend in the direction of the width of a major surface of the series resonator, the supporting members being located at a central portion located along the direction of the length of the major surface of the series resonator; a parallel resonator adapted to vibrate in a length vibration mode and including a piezoelectric substrate having a substantially rectangular shape, electrodes disposed on two opposite major surfaces of the piezoelectric substrate; connection members for bonding the series and parallel resonators, which are stacked so as to form layers and for electrically and mechanically connecting the electrode disposed on one of the major surfaces of the parallel resonator with the electrode disposed on one of the side edge surfaces of the series resonator.

In the case of the piezoelectric resonator and the first and second ladder-type filters of the preferred embodiments of the present invention, a vibrating electrodes are preferably disposed along the entire surface of each of two opposite side edges of the piezoelectric vibrator, whose horizontal section is substantially rectangular, to be used as a series resonator. Further, both side edge portions extending along the length of a major surface of the piezoelectric vibrator are supported by the supporting members which are located at a central portion along the length of the piezoelectric vibrator. In this case, in the first ladder-type filter of the preferred embodiments of the present invention, one of two opposite side edge portions extending along the length of a major surface of the piezoelectric vibrator and the other of the two opposite side edge portions are supported by the first and second supporting members, which are located at a central portion along the length of the piezoelectric vibrator.

Moreover, when the resonators of the preferred embodiments of the present invention are used in the ladder-type filter, the vibrating electrode of the piezoelectric vibrator to be used as a series resonator is mechanically and electrically connected with the piezoelectric resonator to be used as a parallel resonator. Thus, there is no necessity of connecting each resonator at two places via metallic wires as is required in the case of the conventional ladder-type filter. Consequently, the number of components such as metallic wires is small as compared with the conventional ladder-type filter. Thereby, the process of fabricating the filter is simplified. Also, the mounting height of the piezoelectric vibrators is reduced in comparison with those used in the conventional resonator. Consequently, a low-profile product is realized by the preferred embodiments of the present invention using the piezoelectric resonators and ladder-type filters of the preferred embodiments of the present invention. Moreover, the miniaturization of the product can be achieved.

Thus, in accordance with the preferred embodiments of the present invention, there is provided a piezoelectric resonator which can be fabricated at a low cost in such a manner as to have a substantially reduced overall size.

Further, in accordance with the first and second ladder-type filters of the preferred embodiments of the present invention, there is provided a ladder-type filter which can be fabricated at a low cost in such a manner as to have a substantially reduced size.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Hereinafter, preferred embodiments of the present invention will be described in detail by referring to the accompanying drawings.

Figure 1:
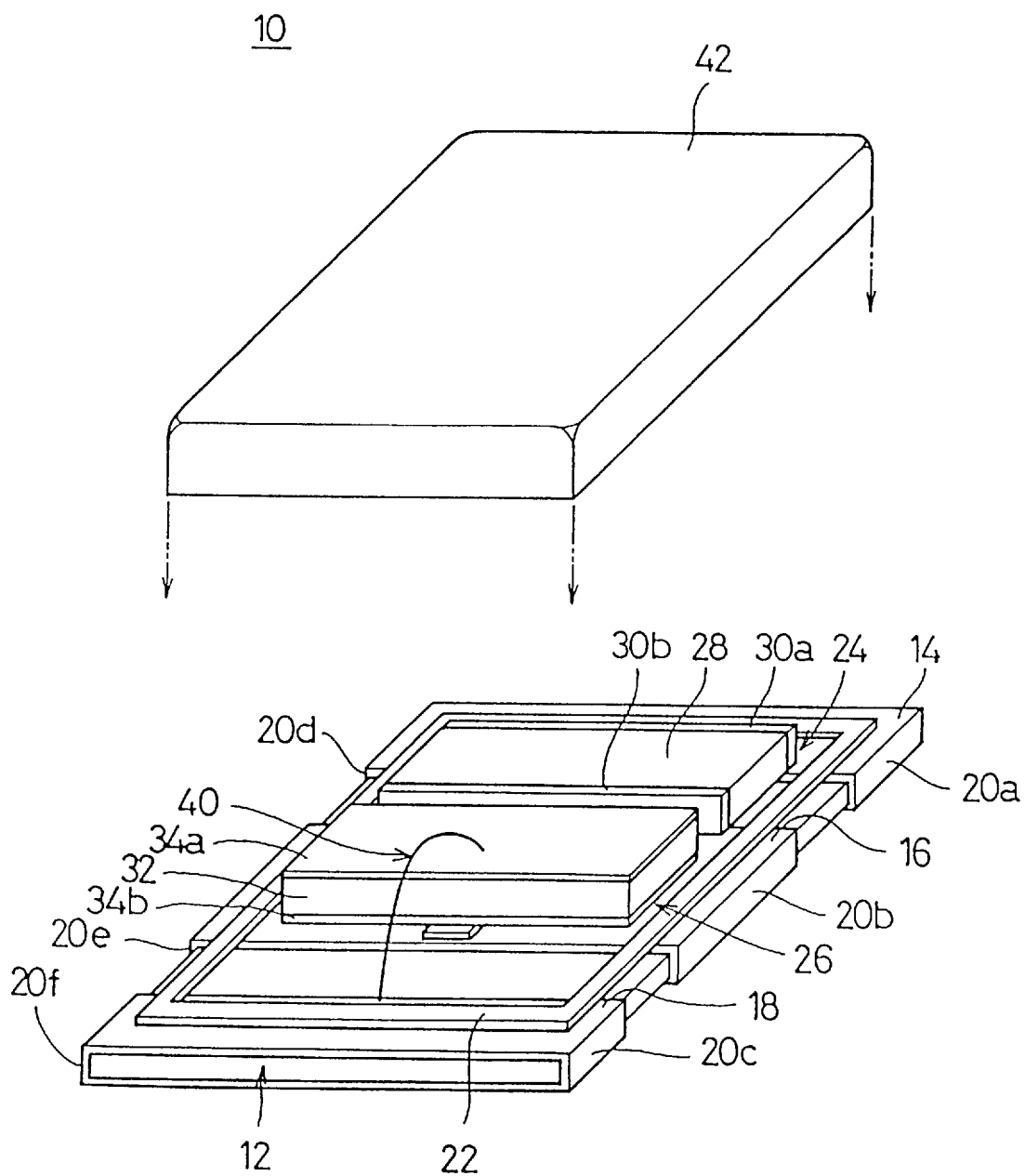
FIG. 1 is a partially exploded perspective diagram illustrating a,preferred embodiment of the present invention.
Figure 2A:
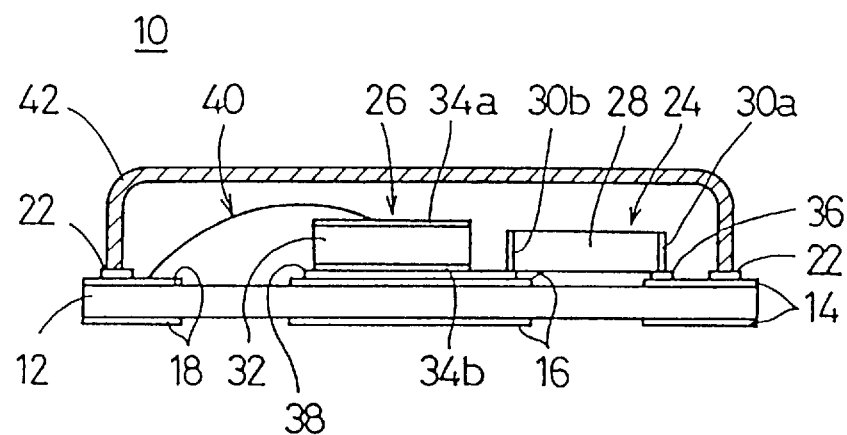
FIG. 2A is a partially sectional diagram illustrating the ladder-type filter of FIG. 1.
Figure 2B:
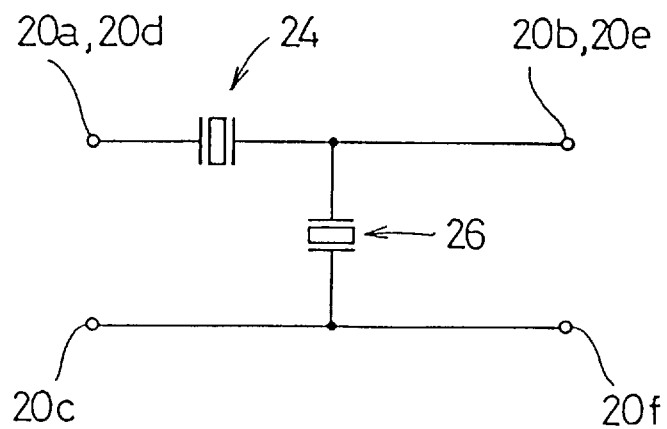
FIG. 2B is a diagram illustrating an electrical equivalent circuit of the ladder-type filter of FIG. 1.

FIG. 1 is a partially exploded perspective diagram illustrating a preferred embodiment of the present invention. FIG. 2A is a partially sectional diagram illustrating the ladder-type filter of FIG. 1. FIG. 2B is a diagram illustrating the electrical equivalent circuit of the ladder-type filter of FIG. 1. Regarding this preferred embodiment, the ladder-type filter, in which the piezoelectric resonator of the preferred embodiments of the present invention is preferably used, and a method of manufacturing this piezoelectric resonator, will be described hereinbelow.

The ladder-type filter 10 preferably has a substantially rectangular substrate 12 made of, for example, aluminum or other suitable material. Further, for instance, three line (or linear) electrodes 14, 16 and 18 are disposed on the front and back surfaces of the substrate 12. The line electrodes 14, 16 and 18 are formed in such a way as to be spaced from each other at predetermined intervals along the direction of the length of the substrate 12 in a range from one of the edge portions which extends in the direction of the width of the substrate 12 to the opposite edge portion of the substrate 12. The line electrode 14 is provided at an edge portion which extends in the width direction of the substrate 12 and functions as an input electrode. Further, the line electrode 16 is located at a central portion located along the length direction of the substrate 12 and functions as an output electrode. Moreover, the line electrode 18 is located at the opposite edge portion which extends in the width direction of the substrate 12 and functions as a grounding electrode.

Furthermore, external electrodes 20a, 20b and 20c are located on a side edge surface which extends in the length direction of the substrate 12 in such a way as to extend from one of two ends of the line electrodes 14, 16 and 18, respectively. Further, external electrodes 20d, 20e and 20f are located on the other side edge surface which extends in the length direction of the substrate 12 in such a manner as to extend from the other ends of the line electrodes 14, 16 and 18, respectively.

The external electrodes 20a and 20d are connected with both ends of the line electrode 14 which extends on the front and back surfaces of the substrate 12, respectively, and function as input terminals. Further, the external electrodes 20b and 20e are connected with both ends of the line electrode 16 which extends on the front and back surfaces of the substrate 12, respectively, and function as output terminals. Moreover, the external electrodes 20c and 20f are connected with both ends of the line electrode 18 which extends on the front and back surfaces of the substrate 12, respectively, and function as grounding terminals.

These line electrodes 14, 16 and 18 and the external electrodes 20a, 20b, 20c, 20d, 20e and 20f are preferably formed by performing the thick-film (screen) printing by the use of conductive paste made of, for instance, silver, copper, aluminum and other suitable material. Incidentally, for the purpose of promoting solderability, the conductive paste, on which the thick-film printing has been performed, may be plated with materials such as NiAu.

On the other hand, an insulating layer 22 is disposed on the surface of the substrate 12 preferably along the periphery thereof. Further, the insulating layer 22 is preferably formed in the shape of a substantially planar rectangular ring in such a way as to be spaced apart from the peripheral edge of the substrate 12 at a predetermined interval or distance. Moreover, the insulating layer 22 is preferably formed by performing the thick-film printing or the like by the use of insulating materials such as an epoxy resin, a silicone alkyd resin, a phenol resin, and glass paste or other suitable material.

Furthermore, on the surface of the substrate 12, two piezoelectric vibrators 24 and 26 are disposed inside the insulating layer 22 and are disposed to be substantially parallel with each other in such a manner as to be spaced from each other along the direction of the length of the substrate 12. Further, the two piezoelectric vibrators 24 and 26 are disposed in such a way that one of two major surfaces of each of the vibrators 24 and 26 face the surface of the substrate 12.

One of the piezoelectric vibrators 24 has a piezoelectric substrate 28 made of, for instance, piezoelectric ceramics, whose horizontal section is substantially rectangular. A vibrating electrode 30a is disposed on the entire surface of one of two opposite side edges extending along the length of the piezoelectric substrate 28. Further, a vibrating electrode 30b is formed on the entire surface of the other of the two opposite side edges extending along the length of the piezoelectric substrate 28. This piezoelectric vibrator 24 preferably vibrates in a length or longitudinal vibration mode and is used as a series resonator. However, other suitable vibration modes may be used for the vibrator 24.

The other piezoelectric vibrator 26 has a piezoelectric substrate 32 made of, for instance, piezoelectric ceramics, whose horizontal section is substantially rectangular. The piezoelectric substrate 32 is preferably formed in such a way as to have a similar shape, dimensions, thickness and a nearly equal size as the aforementioned substrate 28 does. A vibrating electrode 34a is disposed on the entire surface of the front or top major surface of the piezoelectric substrate 32. Further, a vibrating electrode 34b is disposed on the entire surface of the back major surface of the piezoelectric substrate 32. This piezoelectric vibrator 26 preferably vibrates in a length or longitudinal vibration mode and is used as a parallel resonator. However, other suitable vibration modes may be used for the vibrator 26.

The piezoelectric vibrator 24 is supported on the front-surface side of the substrate 12 by being bonded thereto preferably by using a conductive adhesive agent obtained by mixing a filler made of a conductive material such as silver into a thermosetting resin such as a silicone resin and an epoxy resin. One side edge portion and an opposite side edge portion of the piezoelectric vibrator 24, are supported by conductive adhesive agents 36 and 38 which act as first and second supporting members. Especially, in the case of using the silicone-resin-based conductive adhesive agent, vibration leakage can be absorbed by the elasticity of the silicone resin. Thus, this preferred embodiment provides an advantage in securely preventing the characteristics of the resonator from being deteriorated.

In the piezoelectric vibrator 24 to be used as a series resonator, one of the vibrating electrodes 30a is bonded to the line electrode 14 preferably by using the conductive adhesive agent 36, while the other vibrating electrode 30b is bonded to the line electrode 16 preferably by using the conductive adhesive agent 38.

Further, in the piezoelectric vibrator 26 to be used as a parallel resonator, one of the vibrating electrodes 34b is bonded to the line electrode 16 preferably by using the conductive adhesive agent 38. In this case, the other vibrating electrode 30b of the piezoelectric vibrator 24 is mechanically and electrically connected to the line electrode 16 preferably by using the conductive adhesive agent 38. This conductive adhesive agent 38 also acts as a third supporting member for connecting the vibrating electrodes 30b and 34b.

Moreover, a member for mechanically and electrically connecting the other vibrating electrode 34a of the piezoelectric vibrator 26 with the line electrode 18 is, for example, a metallic wire 40. Further, for instance, a one-side opened metallic cap 42 is put on and fixed to the surface of the substrate 12 in such a manner as to cover the two piezoelectric vibrators 24 and 26 and the metallic wire 40. In this case, the periphery of the opening end portion of the metallic cap 42 is fixed onto the insulating layer 22 formed on the substrate 12 by using a fixation device or material (not shown) such as an insulating adhesive agent.

In the case of this ladder-type filter 10, as illustrated in FIG. 2B, the piezoelectric vibrator 24 is connected in series between the external electrodes 20a and 20d, which act as input terminals, and the external electrodes 20b and 20e, which act as output terminals. Further, the piezoelectric vibrator 26 connected to the piezoelectric vibrator 24 is further connected in parallel therebetween. In the case of this preferred embodiment, the piezoelectric vibrators 24 and 26 form what is called a two-element-per-stage ladder structure in which series elements and parallel elements are alternately connected to form a ladder.

Incidentally, in the case of the ladder-type filter to which the piezoelectric resonators of the preferred embodiments of the present invention are applied, a ladder structure having two stages or more may be formed by using a plurality of sets of the series resonators and the parallel resonators, which are constructed as described above. Further, in the case of the aforementioned preferred embodiment, in the piezoelectric vibrator 26 to be used as the parallel resonator, one of the vibrating electrodes 34b may be connected to the line electrode 18, which acts as a grounding electrode, preferably by using the conductive adhesive agent 38. Moreover, the other vibrating electrode 34a may be electrically connected to the line electrode 16, which acts as an output electrode, by using, for example, a metallic wire.

Next, an example of a method of manufacturing this ladder-type filter 10 will be described hereinbelow by referring to, for instance, FIGS. 3A to 3G.

Figure 3A:
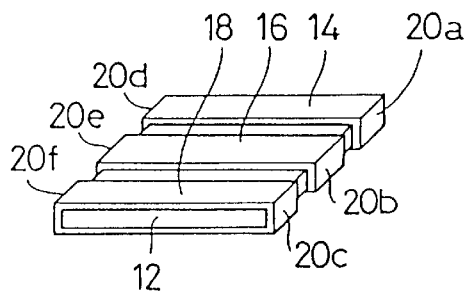
FIGS. 3A 3G are diagrams illustrating a method of manufacturing the tadder-type filter of FIGS. 1, 2A and 2B.

First, the substrate 12, whose horizontal section is preferably substantially rectangular, is prepared. For example, thick-film printing via the use of conductive materials such as silver paste is performed onto predetermined portions respectively corresponding to the line electrode 14, which acts the input electrode, the line electrode 16, which acts as the output electrode, the line electrode 18, which acts as the grounding electrode, and the external electrodes 20a, 20b, 20c, 20d, 20e and 20f on this substrate 12 as illustrated in FIG. 3A. Thereafter, the sintering of the substrate 12 is performed. As a result, the line electrodes 14, 16 and 18 and the external electrodes 20a, 20b, 20c, 20d, 20e and 20f are formed.

Figure 3B:
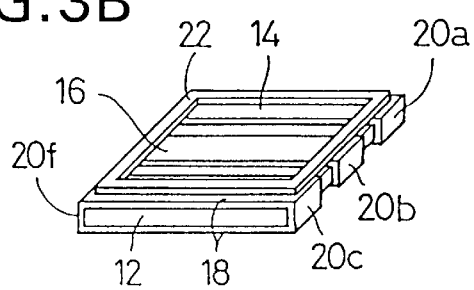

Further, on the surface of the substrate 12, as illustrated in FIG. 3B, the insulating layer 22 is formed by performing printing or the like via the use of insulating materials such as an epoxy resin, a silicone alkyd resin, a phenol resin and glass paste at the positions, which are preferably spaced apart from the peripheral edge thereof at a predetermined interval or distance preferably formed to have a planar rectangular ring shape and by subsequently being heated. Thereafter, the conductive materials of each of the electrodes 14, 16 and 18 may be plated with materials such as NiAu and Au, if necessary.

Figure 3C:
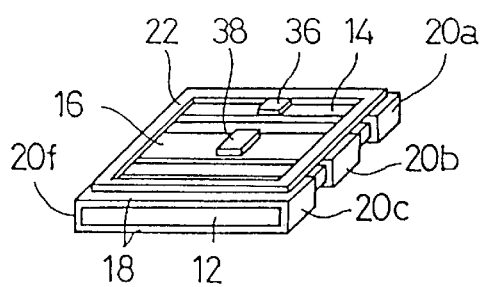

Further, as shown in FIG. 3C, a central portion located along the direction of the width of the input electrode 14 is coated with the conductive adhesive agent 36 made of a thermosetting adhesive agent such as silicone and epoxy, into which the conductive filler such as silver is mixed, to be used as a supporting member by performing a process such as a printing and transferring. Moreover, a central portion located along the direction of the width of the line electrode 16 is coated with the conductive adhesive agent 38, by performing a similar process.

Meanwhile, the piezoelectric vibrator 24, which is used as the series resonator, and the piezoelectric vibrator 26, which is used as the parallel resonator, are formed.

Figure 4A:
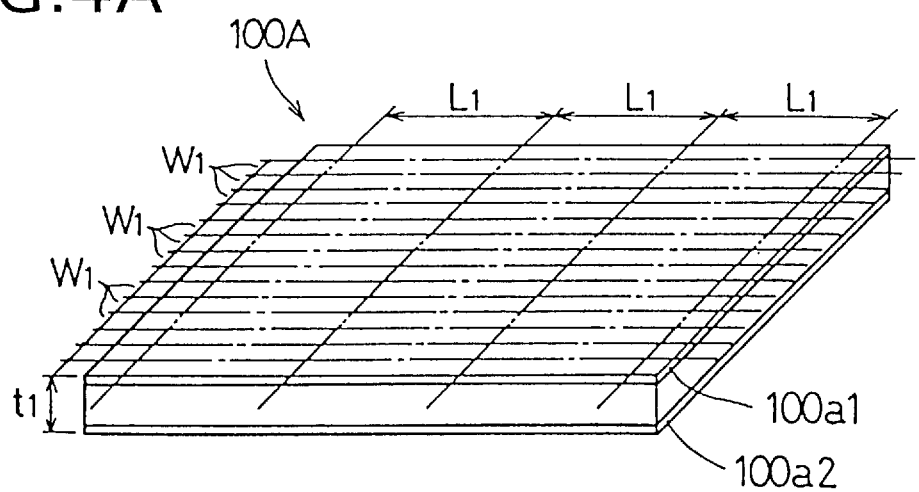
FIG. 4A is a perspective diagram illustrating a method of manufacturing a piezoelectric vibrator which is used in the ladder-type filter of FIGS. 1 to 3G and functions as a series resonator.
Figure 5A:
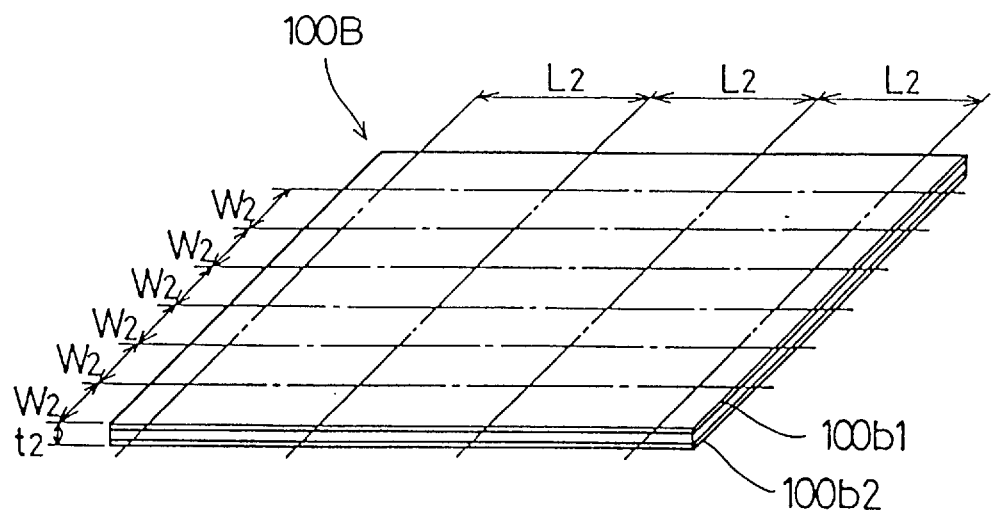
FIG. 5A is a perspective diagram illustrating a method of manufacturing a piezoelectric vibrator which is used in the ladder-type filter of FIGS. 1 to 3G and functions as a parallel resonator.

First, as illustrated in FIGS. 4A and 5A, mother (or master) substrates 100A and 100B made of substantially rectangular piezoelectric ceramics, which are formed in such a manner that the thicknesses thereof are t1 and t2, are prepared.

Next, the thick-film printing via the use of conductive materials such as silver paste is performed on the entire front and back surfaces of the mother substrates 100A and 100B. Thereafter, the sintering of the mother substrates 100A and 100B and conductive materials thereon is performed. As a result, the vibrating electrodes 100a1, 100a2, 100b1 and 100b2 are formed on the entire front and back surfaces of the mother substrates 100A and 100B, respectively. In this case, the mother substrate 100A is polarized in the direction of an arrow P1 drawn from the vibrating electrode 100a1 to the vibrating electrode 100a2. Similarly, the mother substrate 100B is polarized in the direction of another arrow P2 drawn from the vibrating electrode 100b1 to the vibrating electrode 100b2.

Incidentally, the formation of a thin film from NiCr, NiCu and Ag by performing a sputtering, a deposition or the like may be employed as the method of forming the vibrating electrodes 100a1, 100a2, 100b1 and 100b2, instead of the aforementioned printing and sintering method. In addition, other suitable methods of forming vibrating electrodes may be used.

Figure 4B:
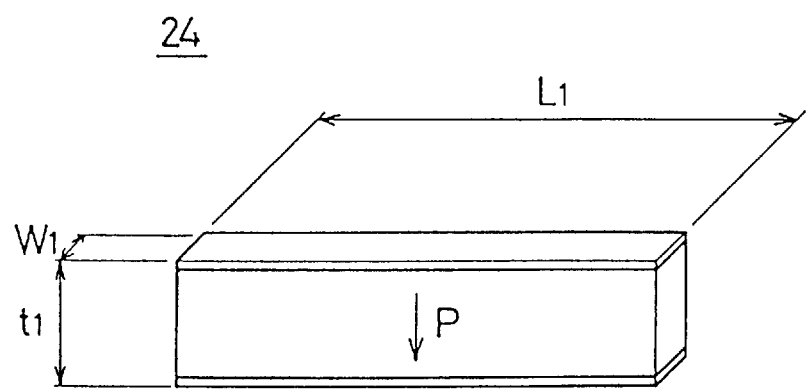
FIG. 4B is a perspective diagram illustrating a piezoelectric vibrator which is produced by the method illustrated in FIG. 4A.
Figure 5B:
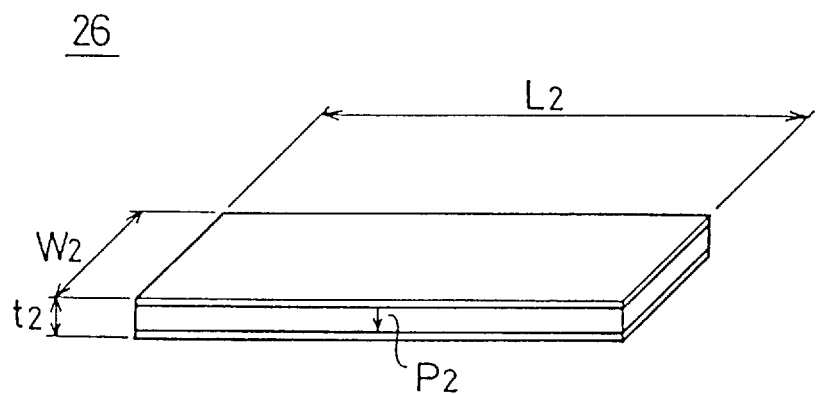
FIG. 5B is a perspective diagram illustrating a piezoelectric vibrator which is produced by the method illustrated in FIG. 5A.

Then, the mother substrates 100A and 100B are cut along cutting plane lines as indicated by one-dot chain lines of FIGS. 4A and 5A. The mother substrate 100A is cut at an interval of L1 in the direction of the length thereof and at an interval of w1 in the direction of the width thereof. Further, the mother substrate 100B is cut at an interval of L2 in the direction of the length thereof and at an interval of w2 in the direction of the width thereof. In this case, the length of the piezoelectric vibrator is determined by a frequency constant inherent in the piezoelectric material. The intervals L1 and L2 may preferably be, for example, 4.2 mm. Moreover, the width and thickness of the piezoelectric vibrator are determined by the desired capacitance ratio between the objective piezoelectric vibrators. In the case of this preferred embodiment, when a filter, whose center frequency is 450 KHz, is to be manufactured, the interval (or width) w1 and the thickness t2 are, for instance, 0.3 mm and the interval (or width) w2 and the thickness t1 are, for example, 1.1 mm. Thus, in the case of this preferred embodiment, as illustrated in FIGS. 4B and 5B, the outer dimensions of the piezoelectric vibrator 24 are nearly equal to those of the piezoelectric vibrator 26.

Furthermore, elements, which are cut out of the mother substrates 100A and 100B and then manufactured, become the piezoelectric vibrator 24, which is used as the series resonator, and the piezoelectric vibrator 26 which is used as the parallel resonator.

Figure 3D:
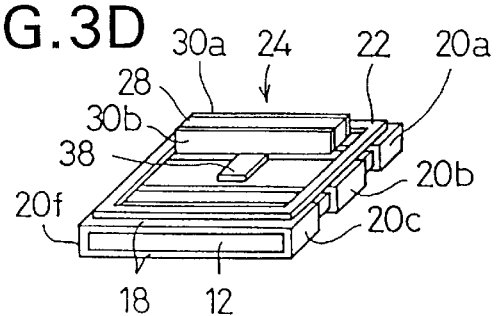

The piezoelectric vibrator 24 formed in this way is then placed on the substrate in such a manner as to straddle the conductive adhesive agents 36 and 38, as illustrated in FIG. 3D. In this case, the piezoelectric vibrator 24 is placed thereon so that one of the vibrating electrodes 30a comes in contact with the conductive adhesive agent 36 and so that the other of the vibrating electrodes 30b comes into contact with an end portion of the conductive adhesive agent 38.

Figure 3E:
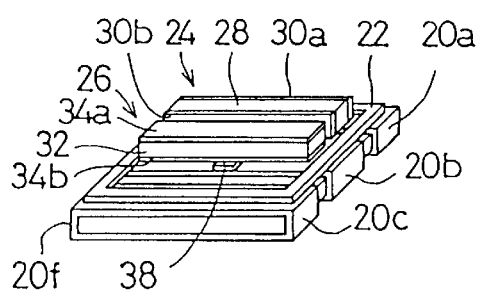
Figure 3F:
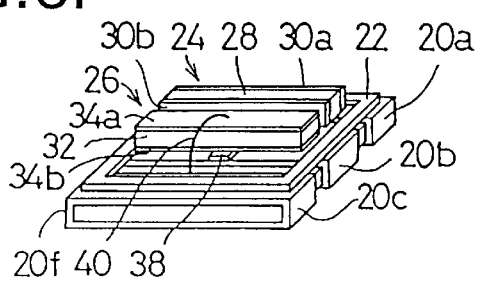
Figure 3G:
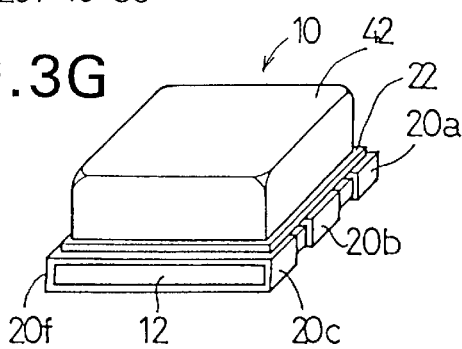

Further, as illustrated in FIG. 3E, the piezoelectric vibrator 26 is placed in such a manner as to be spaced apart from and substantially in parallel with the piezoelectric vibrator 24 by a predetermined interval extending along the length of the substrate 12. In this case, the piezoelectric vibrator 26 is placed thereon in such a way that one of the vibrating electrodes 34b comes in contact with the other end portion of the conductive adhesive agent 38.

Then, the other vibrating electrode 34a of the piezoelectric vibrator 26 is connected with the line electrode 18 through the metallic wire 40 by performing the method such as a resistance welding and wire bonding. Moreover, the metallic cap 42 is fixed onto the surface of the substrate 12 in such a manner as to cover the two piezoelectric vibrators 24 and 26 and the metallic wire 40.

Figure 6:
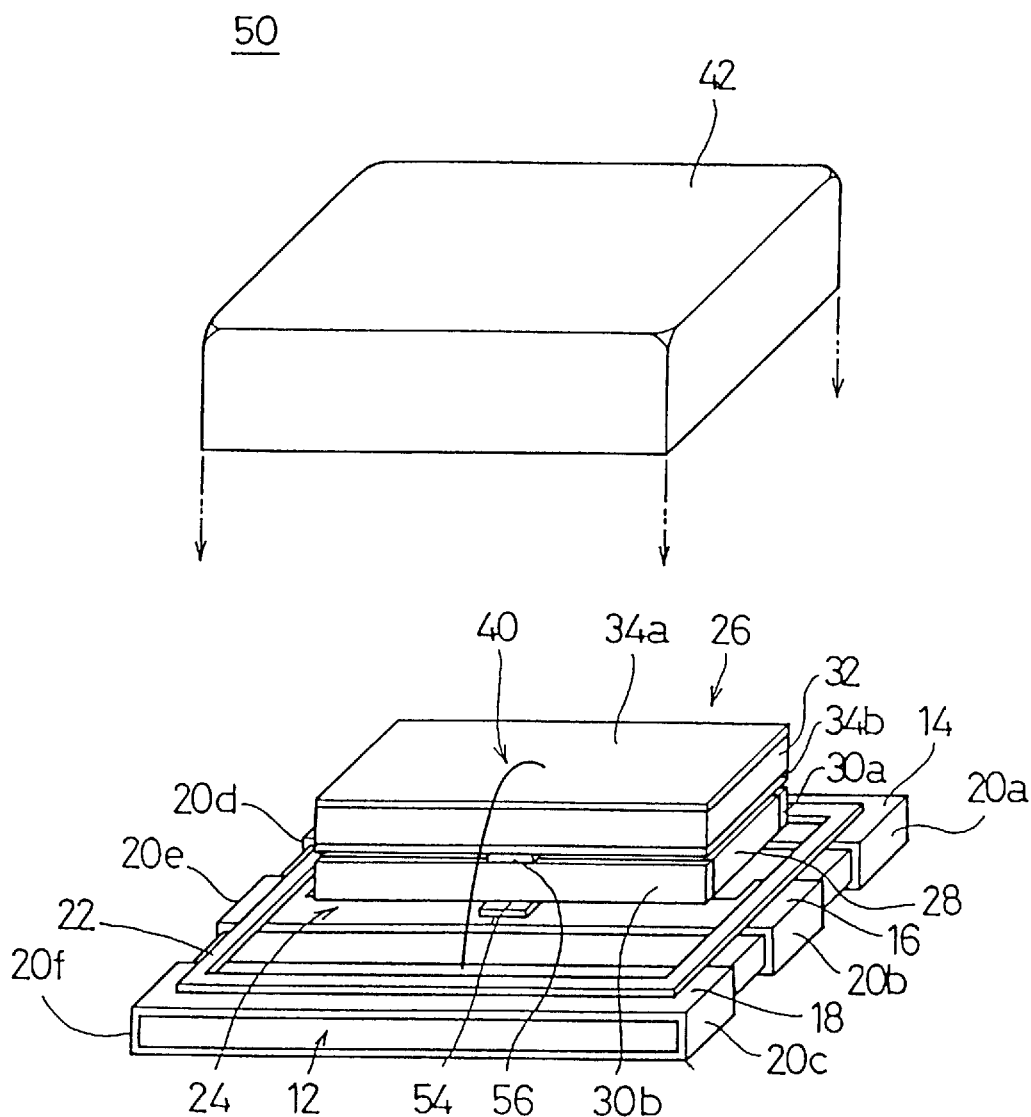
FIG. 6 is a partially exploded perspective diagram illustrating another preferred embodiment of the present invention.
Figure 7A:
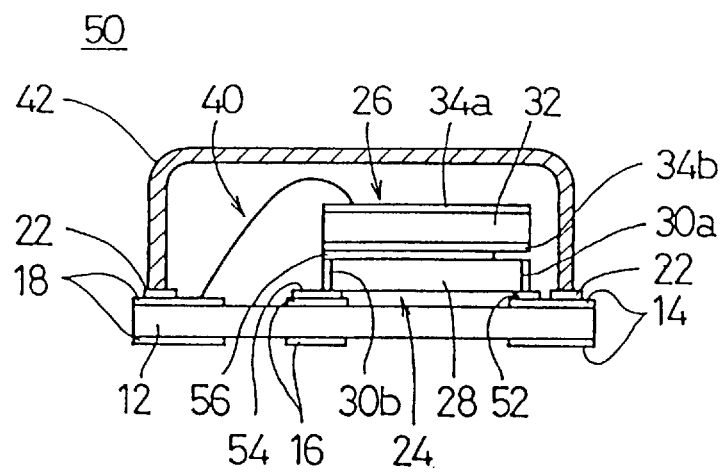
FIG. 7A is a partially sectional diagram illustrating the ladder-type filter of FIG. 6.
Figure 7B:
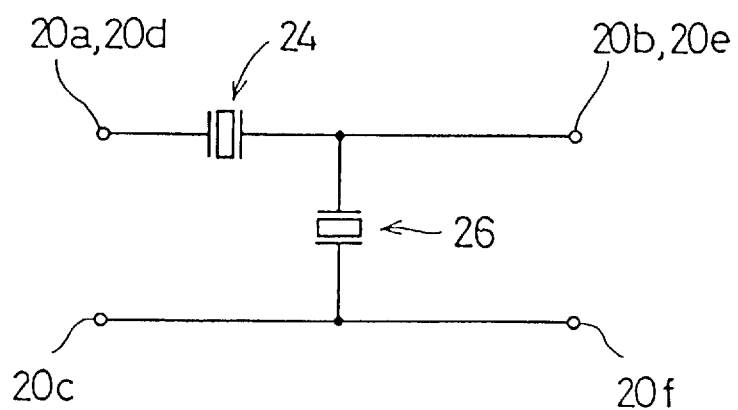
FIG. 7B is a diagram for illustrating an electrical equivalent circuit of the ladder-type filter of FIG. 6.
Figure 8A:
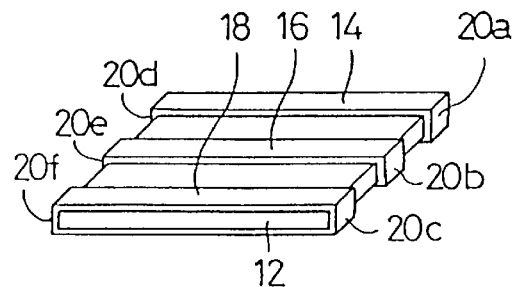
FIGS. 8A to 8H are diagrams illustrating a method of manufacturing the ladder-type filter of FIGS. 6, 7A and 7B.
Figure 8E:
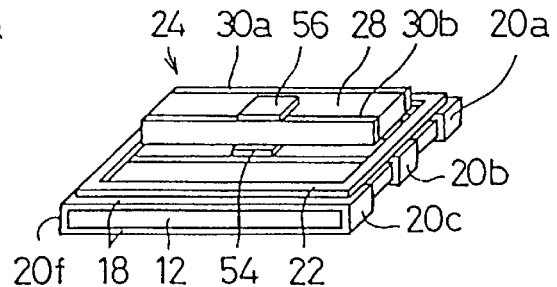
Figure 8B:
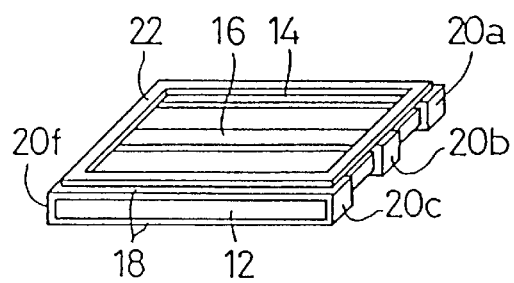
Figure 8F:
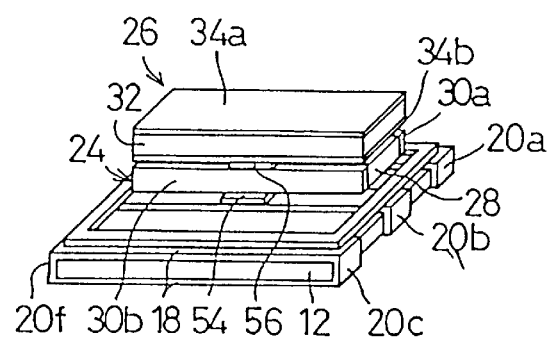
Figure 8C:
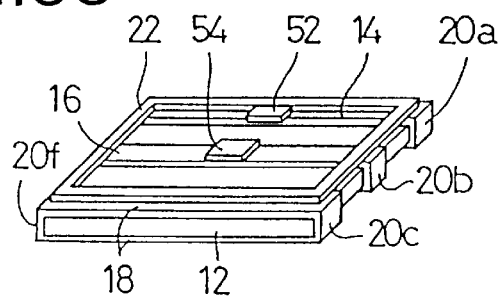
Figure 8G:
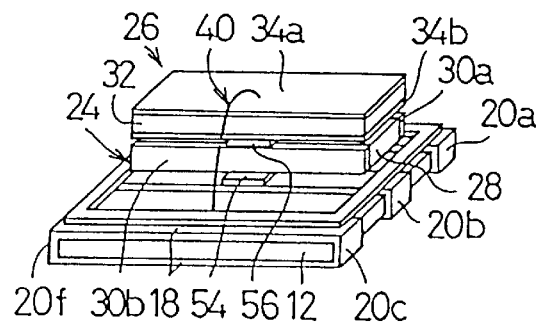
Figure 8D:
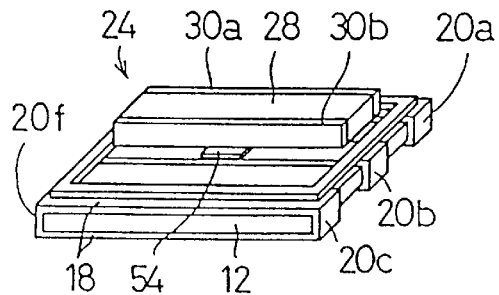
Figure 8H:
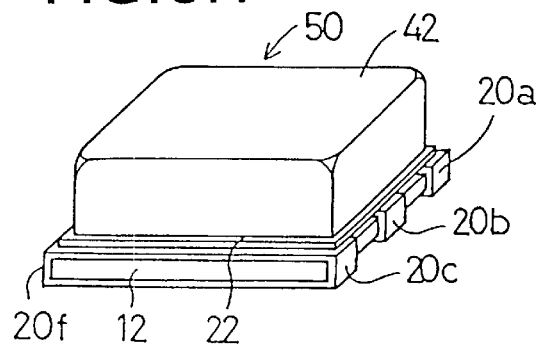

FIG. 6 is a partially exploded perspective diagram illustrating another preferred embodiment of the present invention. FIG. 7A is a partially sectional diagram illustrating the ladder-type filter of FIG. 6. FIG. 7B is a diagram illustrating an electrical equivalent circuit of the ladder-type filter of FIG. 6. FIGS. 8A to 8H are manufacturing process diagrams illustrating a method of manufacturing the ladder-type filter of FIGS. 6, 7A and 7B. Incidentally, members designated by the same reference characters or names as used in FIGS. 1 to 5B have the same or similar structures as the corresponding members illustrated in these figures. Thus, the description of the common parts of these same or similar members is omitted herein.

The ladder-type filter 50 of the preferred embodiment of FIGS. 6 to 8H is different from the ladder-type filter 10 of FIGS. 1 to 3G in the arrangement of the piezoelectric vibrators 24 and 26 on the substrate 12. In this case, in contrast with the case of the ladder-type filter 10 of FIGS. 1 to 3G, in which the piezoelectric vibrator 24, which is used as the series resonator, and the piezoelectric vibrator 26, which is used as the parallel resonator, are put on the surface of the substrate 12 in a flat, side-by-side manner, the piezoelectric vibrators 24 and 26 of the ladder-type filter 50 of the preferred embodiment of FIGS. 6 to 7B are stacked on top of each other.

In the case of the ladder-type 50 of this preferred embodiment, one of the vibrating electrodes 30a of the piezoelectric vibrator 24 is connected preferably by using the conductive adhesive agent 52, which is preferably obtained by mixing the conductive material such as silver into the thermosetting resins such as silicone and epoxy resins, according to a method similar to the method employed in the case of the previously described preferred embodiment. Further, the other of the vibrating electrodes 30b is connected to the line electrode 16 preferably by using the conductive adhesive agent 54. Incidentally, the conductive adhesive agents 52 and 54 function as supporting members for supporting the piezoelectric vibrator 24.

Additionally, when using, especially, the silicone-resin-based conductive adhesive agent similarly as in the case of the preferred embodiment of FIGS. 1 to 5B, vibration leakage is absorbed by the elasticity of the silicone resin. Thus, this preferred embodiment also provides an advantage in securely preventing the characteristics of the resonator from being deteriorated.

Then the piezoelectric vibrator 26, which is used as the parallel resonator, is stacked on the piezoelectric vibrator 24 to form a layer and is connected to the vibrator 24 by the connection member 56 preferably formed by the conductive adhesive agent or the like. In this case, one of the vibrating electrodes 34b of the piezoelectric vibrator 26 and the other of the vibrating electrodes 30b of the piezoelectric vibrator 24 are mechanically and electrically connected with each other through the connection member 56. Further, the other of the vibrating electrodes 34a of the piezoelectric vibrator 26 is connected to the line electrode 18 by the metallic wire 40.

Figure 9:
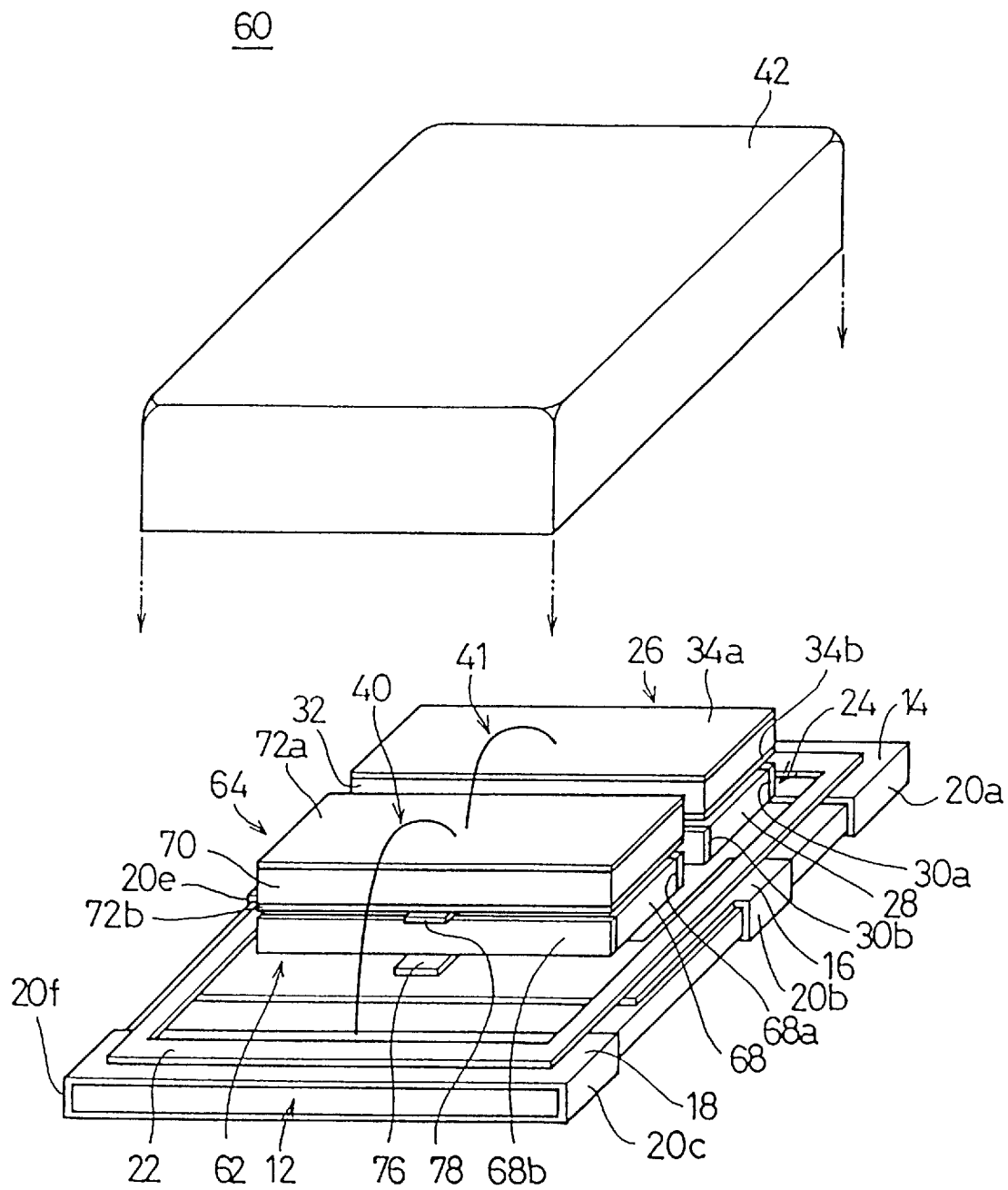
FIG. 9 is a partially exploded perspective diagram illustrating still another preferred embodiment of the present invention.
Figure 10A:
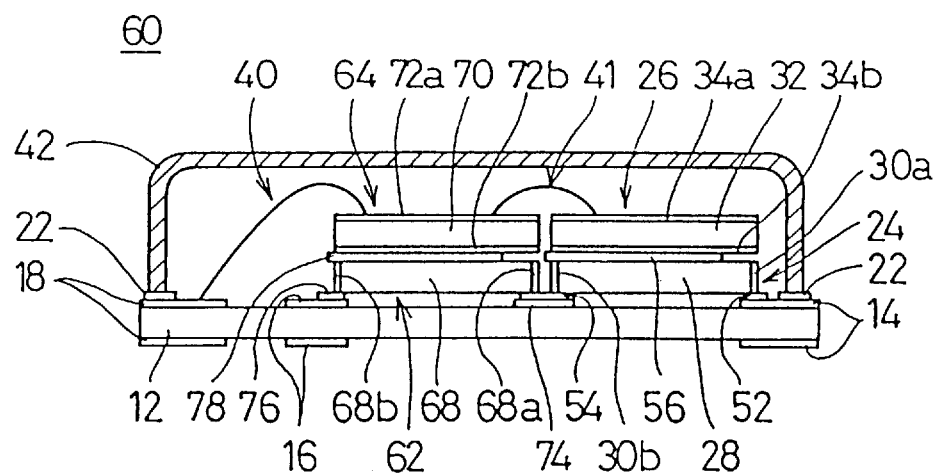
FIG. 10A is a partially sectional diagram illustrating the ladder-type filter of FIG. 9.
Figure 10B:
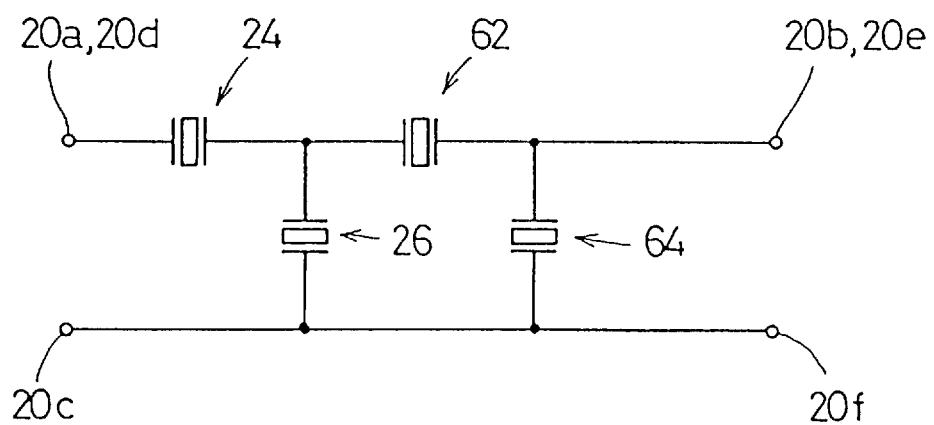
FIG. 10B is a diagram illustrating an electrical equivalent circuit of the ladder-type filter of FIG. 9.

FIG. 9 is a partially exploded perspective diagram illustrating still another preferred embodiment of the present invention. FIG. 10A is a partially sectional diagram illustrating the ladder-type filter of FIG. 9. FIG. 10B is a diagram illustrating an electrical equivalent circuit of the ladder-type filter of FIG. 9. Incidentally, members designated by the same reference characters or names as used in FIGS. 1 to 5B have the same or similar structures as the corresponding members illustrated in these figures. Thus, the description of the common parts of these members is omitted herein.

In the case of the ladder-type filter 60 of the preferred embodiment of FIGS. 9 to 10B, especially, a two-stage ladder-type filter is constituted by four piezoelectric vibrators, differently from the ladder-type filter 50 of FIG. 6 to 8H. In the case of the preferred embodiment of FIGS. 9 to 10B, the piezoelectric vibrators 24 and 62 are used as the first and second series resonators. Further, the piezoelectric vibrators 26 and 64 are used as the first and second parallel resonators. Moreover, the piezoelectric vibrators 62 and 64 preferably have the same structure as the piezoelectric vibrators 24 and 26.

The piezoelectric vibrator 62 contains a piezoelectric substrate 68 which preferably has the same structure as the piezoelectric substrate 28. Further, the vibrating electrodes 68a and 68b are disposed on the entire surface of one of the side edge surfaces extending along the length of the piezoelectric substrate 68 and on the entire surface of the other of the side edge surfaces extending along the length of the piezoelectric substrate 68, respectively, and are preferably adapted to vibrate in a length vibration mode. Other suitable vibration modes may also be used. Further, the piezoelectric vibrator 64 contains a piezoelectric substrate 70 which preferably has the same structure as the piezoelectric substrate 32. Further, the vibrating electrodes 72a and 72b are preferably formed on the entire surface of one of two major surfaces of the piezoelectric substrate 70 and on the entire surface of the other of the two major surfaces of the piezoelectric substrate 70, respectively, and are preferably adapted to vibrate in a length vibration mode, although other vibration modes may be used.

In the ladder-type filter 60 of the preferred embodiment of FIGS. 9 and 10B, as compared with the ladder-type filter 50 of the preferred embodiment of FIGS. 6 to 8H, at a location which is spaced apart from the two piezoelectric vibrators 24 and 26 stacked on the substrate 12 by a predetermined interval, the other two piezoelectric vibrators 62 and 64 are stacked to form layers. Further, on the surface of the substrate 12, a line electrode 74, which is used as an intermediate electrode, is provided between the line electrodes 14 and 16.

In this case, similarly as in the case of the ladder-type filter 50 of the preferred embodiment of FIG. 6 to 8H, one of the vibrating electrodes 30a of the piezoelectric vibrator 24, which is used as the first series resonator, is connected with the line electrode 14 by using the conductive adhesive agent 52. Further, the other of the vibrating electrodes 30b of the piezoelectric vibrator 24 is connected with the line electrode 74 by using the conductive adhesive agent 54. The conductive adhesive agents 52 and 54 function as supporting members for supporting the piezoelectric vibrator 24. Further, the piezoelectric vibrator 26, which is used as the first parallel resonator, is stacked on and bonded onto the piezoelectric vibrator 24 to form a layer by using the first connection member 56.

Furthermore, one of the vibrating electrodes 68a of the piezoelectric vibrator 62, which is used as the second series resonator, is connected with the line electrode 74 preferably via the conductive adhesive agent 54. Further, the other of the vibrating electrodes 68b of the piezoelectric vibrator 62 is connected with the line electrode 16 preferably via the conductive adhesive agent 76. The conductive adhesive agents 54 and 76 function as supporting members for supporting the piezoelectric vibrator 62. Moreover, the piezoelectric vibrator 64, which is used as the second parallel resonator, is stacked on the piezoelectric vibrator 62 to form a layer and bonded thereto, preferably by the conductive adhesive agent 78. In this case, one of the vibrating electrodes 72b of the piezoelectric vibrator 64 is mechanically and electrically connected with the other vibrating electrode 68b of the piezoelectric vibrator 62 through the second connection member 78.

Incidentally, similar to the case of the preferred embodiments of FIGS. 1 to 8H, especially, in the case of using the silicone-resin-based conductive adhesive agent, vibration leakage is absorbed by the elasticity of the silicone resin. Thus, this preferred embodiment also provides an advantage in more securely preventing the characteristics of the resonator from being deteriorated.

Furthermore, the other of the vibrating electrodes 72a of the piezoelectric vibrator 64 is preferably connected to the line electrode 18 via the metallic wire 40. Additionally, the other of the vibrating electrodes 34a of the piezoelectric vibrator 26 is preferably connected to the other vibrating electrode 72a of the piezoelectric vibrator 64 via a metallic wire 41.

Figure 11:
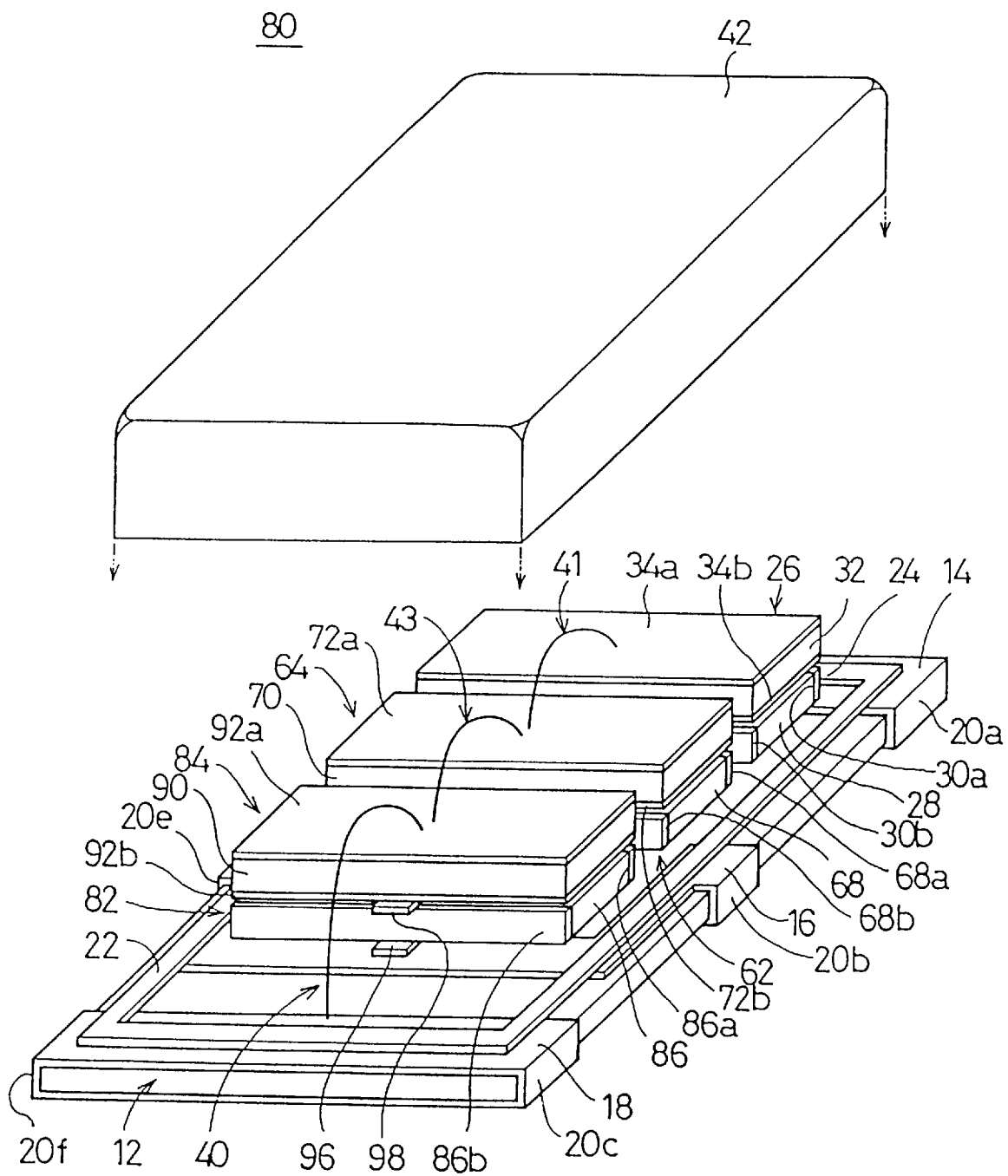
FIG. 11 is a partially exploded perspective diagram illustrating yet another preferred embodiment of the present invention.
Figure 12A:
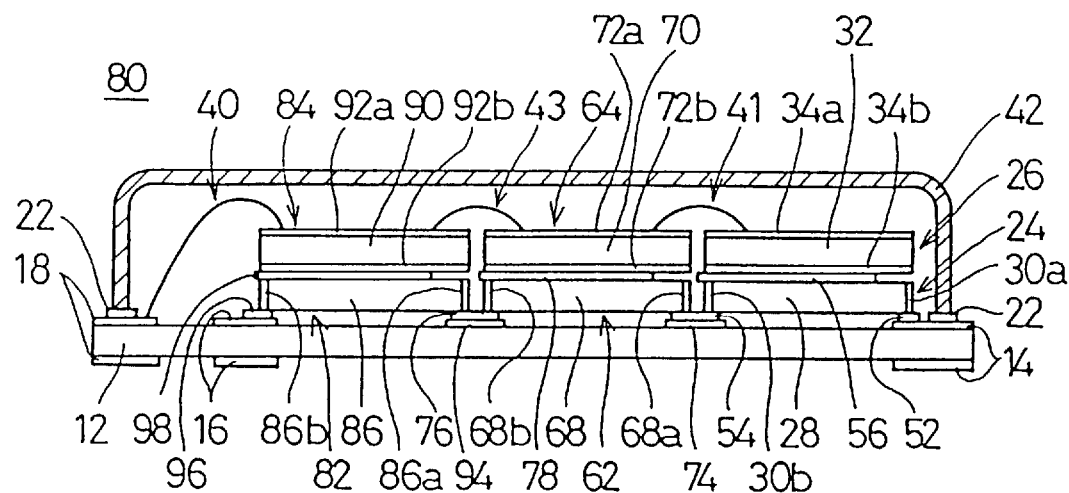
FIG. 12A is a partially sectional diagram for illustrating the ladder-type filter of FIG. 11.
Figure 12B:
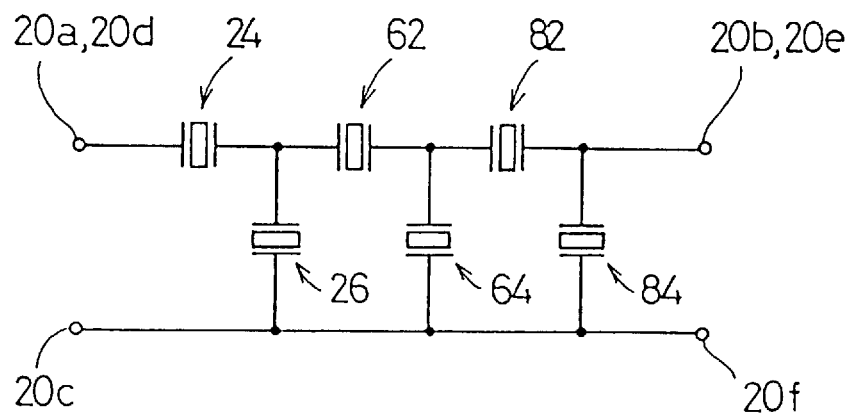
FIG. 12B is a diagram illustrating an electrical equivalent circuit of the ladder-type filter of FIG. 11.

FIG. 11 is a partially exploded perspective diagram illustrating yet another preferred embodiment of the present invention. FIG. 12A is a partially sectional diagram illustrating the ladder-type filter of FIG. 11. FIG. 12B is a diagram illustrating an electrical equivalent circuit of the ladder-type filter of FIG. 11. Incidentally, in these figures, members designated by the same reference characters or names as used in FIGS. 1 to 10B have the same or similar structures as of the corresponding members illustrated in these figures. Thus, the description of the common parts of these members is omitted herein.

In the case of a ladder-type filter 80 of the preferred embodiment of FIGS. 11 to 12B, especially, a three-stage ladder-type filter includes six piezoelectric vibrators, as compared with the ladder-type filter 60 of the preferred embodiment of FIG. 9 to 10B. In the case of the preferred embodiment of FIGS. 11 to 12B, the piezoelectric vibrators 24, 62 and 82 are used as the first, second and third series resonators. Further, the piezoelectric vibrators 26, 64 and 84 are used as the first, second and third parallel resonators. Moreover, the piezoelectric vibrators 82 and 84 preferably have the same or similar structure as of the piezoelectric vibrators 24 and 26.

The piezoelectric vibrator 82 contains a piezoelectric substrate 86 which preferably has the same or similar structure as of the piezoelectric substrate 28. Further, vibrating electrodes 86a and 86b are disposed on the entire surface of one of the side edge surfaces extending along the length of the piezoelectric substrate 86 and on the entire surface of the other of the side edge surfaces extending along the length of the piezoelectric substrate 86, respectively, and are preferably adapted to vibrate in a length vibration mode. Although the length vibration mode is preferred, other suitable vibration modes can be used. Further, the piezoelectric vibrator 84 contains a piezoelectric substrate 90 which preferably has the same structure as the piezoelectric substrate 32. Further, vibrating electrodes 92a and 92b are disposed on the entire surface of one of two major surfaces of the piezoelectric substrate 90 and on the entire surface of the other of the two major surfaces of the piezoelectric substrate 90, respectively, and are preferably adapted to vibrate in a length vibration mode. However, other suitable vibration modes may be used.

In the ladder-type filter 80 of the preferred embodiment of FIGS. 11 and 12B, as compared with the ladder-type filter 60 of the preferred embodiment of FIGS. 9 to 10B, at a location which is spaced apart from the two sets of the piezoelectric vibrators 24 and 26 and the piezoelectric vibrators 62 and 64 stacked on the substrate 12 by a predetermined interval, the other two piezoelectric vibrators 82 and 84 are stacked to form layers. Further, on the surface of the substrate 12, a line electrode 94, which is used as an intermediate electrode, is provided between the line electrodes 74 and 16.

In this case, as compared with the case of the ladder-type filter 60 of the preferred embodiment of FIG. 9 to 10B, one of the vibrating electrodes 86a of the piezoelectric vibrator 82, which is used as the third series resonator, is connected with the line electrode 94 preferably via the conductive adhesive agent 76. Further, the other of the vibrating electrodes 86b of the piezoelectric vibrator 82 is connected with the line electrode 16 preferably via the conductive adhesive agent 96. The conductive adhesive agents 76 and 96 function as supporting members for supporting the piezoelectric vibrator 82. Further, the piezoelectric vibrator 84, which is used as the third parallel resonator, is stacked on and bonded onto the piezoelectric vibrator 82 using the third connection member 98. In this case, one of the vibrating electrodes 92b of the piezoelectric vibrator 84 is mechanically and electrically connected with the other, vibrating electrode 86b of the piezoelectric vibrator 82 through the third connection member 98.

Incidentally, similar to the preferred embodiments of FIGS. 1 to 10B, especially, in the case of using the silicone-resin-based conductive adhesive agent, vibration leakage is absorbed by the elasticity of the silicone resin. Consequently, this preferred embodiment also provides an advantage in more securely preventing the characteristics of the resonator from being deteriorated.

Furthermore, the other of the vibrating electrodes 92a of the piezoelectric vibrator 84 is connected to the line electrode 18 preferably via the metallic wire 40. Additionally, the vibrating electrodes 92a of the piezoelectric vibrator 84 is connected to the other vibrating electrodes 72a of the piezoelectric vibrator 64 preferably via a metallic wire 43.

In the case of the ladder-type filters 10, 50, 60 and 80 of the aforementioned preferred embodiments, the vibrating electrode of the piezoelectric vibrator, which is used as the series resonator, is mechanically and electrically connected with the piezoelectric vibrator, which is used as the parallel resonator, by using the connection members such as the conductive adhesive agent. For example, there is no necessity of connecting each individual resonator at two places by using metallic wires as is required in the conventional ladder-type filter. Consequently, the number of components such as metallic wires is reduced as much as possible. Thereby, in the case of the ladder-type filters 10, 50, 60 and 80, the process of fabricating the filter is simplified. Moreover, the manufacturing cost can be substantially reduced.

Figure 14A:
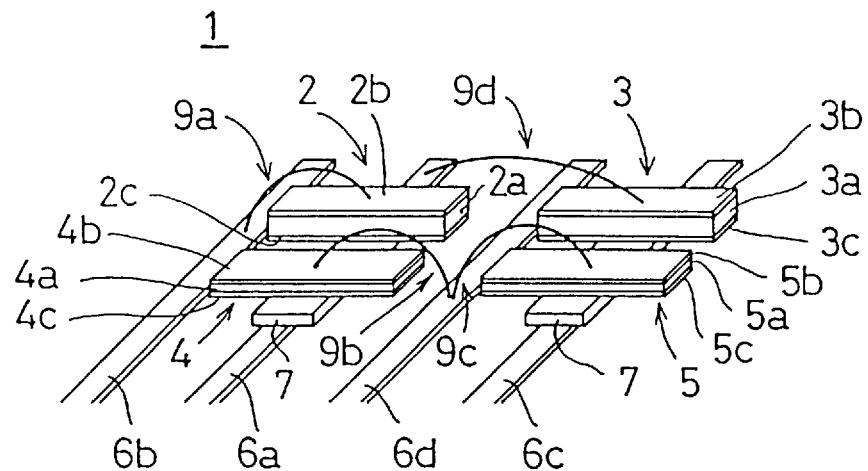
FIG. 14A is a perspective diagram illustrating a primary part of an example of a conventional laddertype filter that provides the background of the present invention.
Figure 14B:
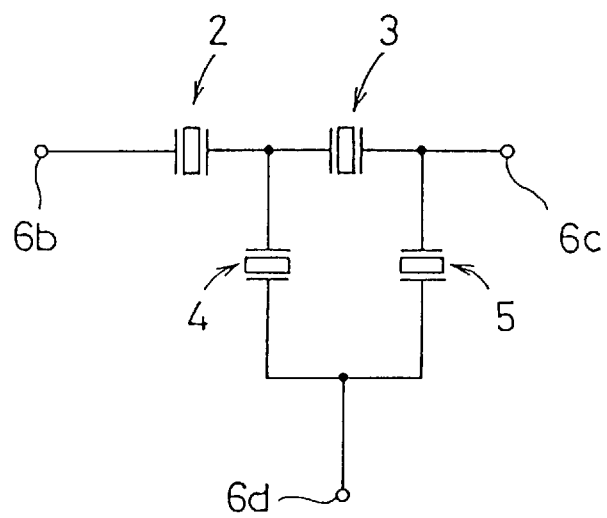
FIG. 14B is a diagram illustrating an electrical equivalent circuit of the conventional ladder-type filter of FIG. 14A.

Further, in the case of the conventional ladder-type filter 1, as illustrated in FIGS. 14A and 14B, for the purpose of securing the sufficient capacitance ratio between the series resonator and the parallel resonator, the piezoelectric vibrators to be used as the series resonators are formed so that the thickness thereof is relatively large. Therefore, when the surface having a full-surface electrode of each of the piezoelectric vibrators is placed face down on terminal plates and the portion of each of the vibrators located in the vicinity of a node of the longitudinal vibration is fixed to the terminal plates by using a conductive adhesive agent, the mounting height of each of the vibrators is high. Consequently, the height of a product incorporating such a ladder-type filter is high which prevents miniaturization of the product.

In contrast with this, in the case of the ladder-type filters 10, 50, 60 and 80 of the aforementioned preferred embodiments of the present invention, the vibrating electrodes are formed on one of the side edge surfaces extending along the length of the substantially rectangular piezoelectric vibrator, which is used as the series resonator, and on the other of the entire side edge surfaces thereof, respectively. Further, both opposite edge portions extending along the length of the piezoelectric vibrator, are supported by supporting members such as the conductive adhesive agent extending along the width of the major surfaces of the piezoelectric vibrator.

Thus, in the case of the ladder-type filters 10, 50, 60 and 80 of the aforementioned preferred embodiments, the mounting height of the piezoelectric vibrators is lowered in comparison with those used in the conventional resonator. Consequently, a low-profile product is realized and miniaturization of the product is achieved according to the preferred embodiments of the present invention.

Figure 13A:
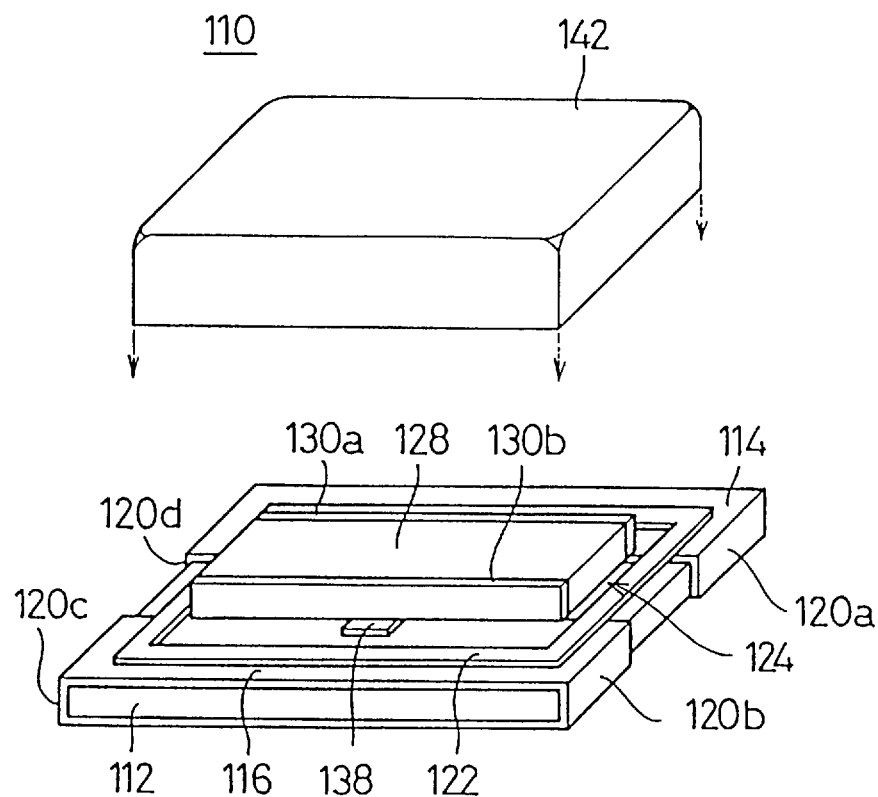
FIG. 13A is a partially exploded perspective diagram illustrating a further preferred embodiment of the present invention.
Figure 13B:
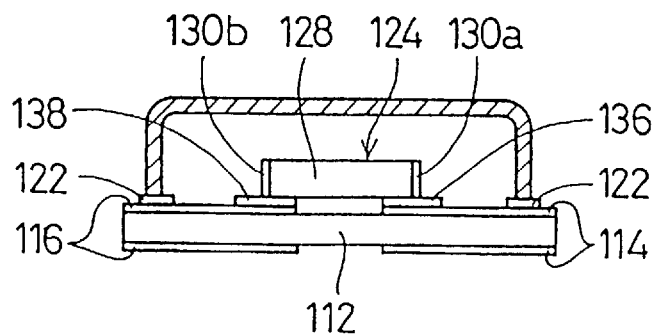
FIG. 13B is a partially sectional diagram illustrating the preferred embodiment of the present invention of FIG. 13A.

FIG. 13A is a partially exploded perspective diagram illustrating a further preferred embodiment of the present invention. FIG. 13B is a partially sectional diagram illustrating the preferred embodiment of the present invention of FIG. 13A. Regarding this preferred embodiment, an example of an oscillator, in which a piezoelectric resonator of the preferred embodiments of the present invention is used, will be described hereinbelow.

This oscillator 110 has a substantially rectangular substrate 112 made of, for example, aluminum or other suitable material. Further, for instance, two line electrodes 114 and 116 are disposed on the front and back surfaces of the substrate 112. The line electrodes 114 and 116 are located at one of the end portion extending in the direction of the width of the substrate 112 in a range from one of the end portions extending in the direction of the length thereof to the other of the end portions.

In the case of this preferred embodiment, the line electrodes 114 and 116 are formed as an input electrode and an output electrode, respectively.

Furthermore, external electrodes 120a and 120b are formed on a side end surface extending in the direction of the length of the substrate 112 in such a way as to extend from ends extending in the direction of the length of the line electrodes 114 and 116, respectively. Further, external electrodes 120c and 120d are formed on the other side end surface extending in the direction of the length of the substrate 112 in such a manner as to extend from the other ends extending in the direction of the length of the line electrodes 114 and 116 respectively.

The external electrodes 120a and 120d are connected with both ends of the line electrode 114 provided on the front and back surfaces of the substrate 112, respectively, and function as input terminals. Further, the external electrodes 120b and 120c are connected with both ends of the line electrode 116 provided on the front and back surfaces of the substrate 112, respectively, and function as output terminals.

The external electrodes 120a to 120d of the line electrodes 114 and 116 are preferably formed by performing the thick-film screen printing by the use of conductive paste made of, for instance, silver, copper and aluminum or other suitable material. Incidentally, for the purpose of promoting solderability, the conductive paste, on which the thick-film printing has been performed, may be further plated with materials such as NiAu and Au.

On the other hand, an insulating layer 122 is preferably formed on the surface of the substrate 112 along the periphery thereof. Further, the insulating layer 122 is preferably formed to have a substantially planar rectangular ring shape in such a way as to be spaced apart from the peripheral edge of the substrate 112 at a predetermined interval or distance. Moreover, the insulating layer 122 is preferably formed by performing thick-film printing or the like by the use of insulating materials such as an epoxy resin, a silicone alkyd resin, a phenol resin and glass paste.

Furthermore, for instance, a piezoelectric vibrator 124 is disposed inside the insulating layer 122 in such a way that one of major surfaces of the vibrator 124 face the surface of the substrate 112.

The piezoelectric vibrator 124 preferably has a piezoelectric substrate 128 made of, for instance, piezoelectric ceramics, and has a substantially rectangular shape. A vibrating electrode 130a is disposed on the entire surface of one of opposite side edges extending in the direction of the width of the piezoelectric substrate 128. Further, a vibrating electrode 130b is disposed on the entire surface of the other of the opposite side edges extending in the direction of the width of the piezoelectric substrate 128. This piezoelectric vibrator 124 preferably vibrates in a length or longitudinal vibration mode and is used as a series resonator. However, other suitable vibration modes could be used for the vibrator 124.

In the piezoelectric vibrator 124, opposite edge portions extending along the length thereof, are supported on the substrate 112 preferably by the use of the conductive adhesive agents 136 and 138, which act as the supporting members.

In this case, one of the vibrating electrodes 130a of the piezoelectric vibrator 124 is bonded to the line electrode 114 preferably via the conductive adhesive agent 136. The other of the vibrating electrodes 130b of the piezoelectric vibrator 124 is bonded to the line electrode 116 preferably via the conductive adhesive agent 138. One of the vibrating electrodes 130a of the piezoelectric vibrator 24 and the other of the vibrating electrodes 130b thereof are mechanically and electrically connected to the line electrodes 114 and 116 preferably through the conductive adhesive agents 136 and 138, respectively. The conductive adhesive agents 136 and 138 also function as the connection members for electrically connecting the line electrodes 114 and 116 with the vibrating electrodes 130a and 130b, respectively.

Incidentally, similar to the aforementioned preferred embodiments, especially, in the case of using the silicone-resin-based conductive adhesive agent, vibration leakage is absorbed by the elasticity of the silicone resin. Consequently, this preferred embodiment also provides an advantage in more securely preventing the characteristics of the resonator from being deteriorated.

Further, for instance, a one-side opened metallic cap 142 is put on and fixed to the surface of the substrate 112 in such a manner as to cover the piezoelectric vibrator 124. In this case, the periphery of the opening end portion of the metallic cap 142 is fixed onto the insulating layer 122 formed on the substrate 112 by using a fixation member or device (not shown) such as an insulating adhesive agent.

Although the preferred embodiments of the present invention have been described above, it should be understood that the present invention is not limited thereto and that other modifications will be apparent to those skilled in the art without departing from the spirit of the invention. The scope of the present invention, therefore, should be determined solely by the appended claims.

What is claimed is:

1. A ladder-type filter comprising:
    a first resonating element including a first piezoelectric substrate having a first plurality of electrodes disposed on each of opposite side edges of the first piezoelectric substrate;
    a second resonating element including a second piezoelectric substrate having a second plurality of electrodes disposed on each of opposite major upper and lower surfaces thereof;
    a supporting structure supporting the first and second resonating elements; and
    at least two conductive supporting members disposed on the supporting structure and being spaced from each other along a horizontal surface of the supporting structure; wherein
    the first resonating element is mounted on both of the at least two conductive supporting members such that one of the opposite side edge portions of the first resonating element is supported on a first one of the at least two conductive supporting members and the other of the opposite side edge portions of the first resonating element is supported by a second one of the at least two conductive supporting members and the second resonating element is supported only by the second one of the at least two supporting members and is spaced from the first resonating element along the second one of the at least two supporting members.

2. The ladder type filter according to claim 1, wherein the at least two supporting members each comprise silicone-resin-based conductive adhesive agent.

3. The ladder type filter according to claim 1, further comprising a cap mounted on the supporting structure and enclosing the first and second resonating elements.

4. The ladder type filter according to claim 1, wherein the second one of the at least two supporting members electrically connects one of the electrodes disposed on the first resonating element to one of the electrodes disposed on the second resonating element.

5. The ladder type filter according to claim 1, wherein the first resonating element is arranged to straddle a space between the first and second supporting members.

6. The ladder type filter according to claim 1, wherein an upper major surface of the supporting structure for supporting the first and second resonator elements is substantially parallel to upper and lower major surfaces of the first and second resonator elements.

7. The ladder type filter according to claim 1, wherein one of the first plurality of electrodes of the first resonating element disposed on a first one of the opposite side edges of the first piezoelectric substrate and one of the second plurality of electrodes of the second resonating element disposed on a first one of the opposite major upper and lower surfaces of the second piezoelectric substrate, are electrically connected to each other via the second one of the at least two supporting members.

8. A ladder-type filter comprising:
    a support substrate having first, second and third conductive paths;
    a series resonator including a piezoelectric substrate having electrodes disposed on two opposite side edge surfaces of the piezoelectric substrate;

a parallel resonator including a piezoelectric substrate having electrodes disposed on two opposite major surfaces of the piezoelectric substrate, the parallel resonator being arranged in such a way as to be stacked in a vertical direction relative to the support substrate on the series resonator and spaced from the series resonator;

first and second supporting members disposed on said support substrate spaced from each other such that each of the first and second supporting members is located at one of two opposite edge portions of a bottom major surface of the series resonator and are arranged to support the series resonator and to electrically connect the electrodes disposed on one of the opposite side edge surfaces of the series resonator and on the other of the opposite side edge surfaces of the series resonator with the first and second conductive paths, respectively, the series resonator being arranged to straddle a gap located between the first and second supporting members;

a third supporting member which is disposed between the parallel resonator and the series resonator and is arranged to support the parallel resonator on the series resonator in a vertically stacked arrangement and to electrically connect one of the electrodes disposed on the major surface of the parallel resonator with one of the second and third conductive paths; and a connection member for electrically connecting one of the second and third consecutive paths which is not connected to the one of the electrodes of the parallel resonator, with the other of the electrodes of the parallel resonator.

9. The ladder type filter according to claim 8, wherein both the parallel and series resonators straddle a distance between the first and second supporting members.

10. The ladder type filter of claim 8, wherein said third supporting member comprises a conductive adhesive which is located in the stack defined by the series resonator and the parallel resonator.

11. The ladder type filter according to claim 10, wherein the series resonator and the parallel resonator are separated from each other by only the conductive adhesive.

12. The ladder type filter according to claim 8, wherein said third supporting member comprises a conductive adhesive which extends along more than half of a width of each of the series and parallel resonators.

13. The ladder type filter according to claim 8, wherein opposite major surfaces of the series resonator are parallel to opposite major surfaces of the parallel resonator.

14. The ladder type filter according to claim 8, wherein the parallel resonator straddles a horizontal distance between the first and second supporting members.

15. A ladder-type filter comprising:

a series resonator including a piezoelectric substrate having electrodes disposed on each of opposite side edge surfaces of the piezoelectric substrate;

a conductive supporting member that is arranged to support one of the two opposite side edge portions extending along the length of a major surface of the series resonator;

a parallel resonator including a piezoelectric substrate having electrodes disposed on one of two opposite major surfaces of the piezoelectric substrate;

a connection member located between the series and parallel resonators for bonding the series and parallel resonators, which are stacked on top of each other such that opposite major surfaces of each of the series and parallel resonators are substantially parallel to each other so as to define layers and for electrically and mechanically connecting the electrode disposed on one of the major surfaces of the parallel resonator with the electrode disposed on one of the side edge surfaces of the series resonator.

16. The ladder type filter according to claim 15, further comprising a support substrate having the first and second resonators disposed on a mounting surface thereof such that the upper and lower major surfaces of each of the first and second resonators are substantially parallel to the mounting surface of the support substrate.

17. The ladder type filter according to claim 15, further comprising a further conductive supporting member that is arranged to support the other of the two opposite side edge portions extending along the length of a major surface of the series resonator.

18. The ladder type filter according to claim 17, wherein the series resonator is arranged to straddle a gap located between the conductive supporting member and the further conductive supporting member.

19. The ladder type filter according to claim 15, wherein said connection member comprises a conductive adhesive which is located in the stack defined by the series resonator and the parallel resonator.

20. The ladder type filter according to claim 19, wherein the series resonator and the parallel resonator are separated from each other by only the conductive adhesive.

* * * * *